(12) United States Patent
Reilly (10) Patent No.: US 6,593,864 B1
(45) Date of Patent: Jul. 15, 2003

(54) DIGITAL-TO-ANALOG CONVERTER WITH TEMPERATURE COMPENSATION

(75) Inventor: Timothy J. Reilly, Plymouth, MN (US)

(73) Assignee: Optical Solutions, Inc., Minneapolis, MN (US)

( * ) Notice: Subject to any disclaimer, the term of this patent is extended or adjusted under 35 U.S.C. 154(b) by 0 days.

(21) Appl. No.: 10/124,114

(22) Filed: Apr. 15, 2002

(51) Int. Cl.[7] ............................................. H03M 1/06
(52) U.S. Cl. ........................ 341/119; 341/144; 375/238
(58) Field of Search ............................... 341/120, 118, 341/144, 152, 119; 375/238

(56) References Cited

U.S. PATENT DOCUMENTS

| | | | | |
|---|---|---|---|---|
| 4,381,495 A | * | 4/1983 | Hotta et al. ................. | 341/120 |
| 4,381,497 A | | 4/1983 | Lillis et al. ................. | 341/119 |
| 4,590,457 A | | 5/1986 | Amir .......................... | 341/145 |
| 4,647,906 A | | 3/1987 | Naylor et al. ............... | 341/119 |
| 5,481,560 A | | 1/1996 | Potetz et al. ................ | 375/238 |
| 5,712,636 A | | 1/1998 | Buch .......................... | 341/152 |
| 5,764,165 A | | 6/1998 | Buch .......................... | 341/53 |
| 6,181,266 B1 | | 1/2001 | Toki ........................... | 341/52 |

FOREIGN PATENT DOCUMENTS

JP         01-102925         * 9/1999 ............ H03M/1/10

OTHER PUBLICATIONS

"Unit VI from I/O Control with the SX Microcontroller" Al Williams, Parallax, Inc., pp. 75–84, 1999.
"Balancing D/A Conversion on One Pin" Mariano Barron and Javier Martinez, Circuit Cellar, Issue 140, pp. 52–59, Mar. 2002.

* cited by examiner

Primary Examiner—Peguy JeanPierre
(74) Attorney, Agent, or Firm—Shumaker & Sieffert (57) ABSTRACT

A PWM DAC including an emitter follower buffer circuit provides increased accuracy and reduced cost. The emitter follower buffer circuit that enables inexpensive implementation of the PWM DAC. A temperature compensation circuit adjusts the digital input value applied to the PWM to compensate for temperature-induced variation introduced by the emitter follower buffer circuit. The compensation circuit may incorporate circuitry that replicates the PWM DAC at least in part, and monitors the base-emitter voltage of a replicated emitter follower buffer to track temperature-induced variation in the PWM DAC. The compensation circuit generates an error value that can be used to compensate one or more PWM DACs within a particular system.

36 Claims, 7 Drawing Sheets

DIGITAL-TO-ANALOG CONVERTER WITH TEMPERATURE COMPENSATION

TECHNICAL FIELD

The invention relates to digital-to-analog converters and, more particularly, digital-to-analog converters incorporating temperature compensation circuitry.

BACKGROUND

A pulse width modulation (PWM)-based digital-to-analog converter (DAC) converts digital input values into an analog output waveform. A typical PWM DAC generates an output pulse having a pulse width that is a function of a digital input value. A low pass filter circuit converts the PWM output pulse into an analog output waveform. A PWM offers a relatively inexpensive DAC implementation. Unfortunately, the low pass filter circuit has a high output impedance. For this reason, the PWM DAC ordinarily includes a buffer circuit for current amplification to amplify the analog output waveform produced by the low pass filter circuit. Some types of buffer circuitry include an undesirable temperature dependence, which is transferred to the analog output waveform. Buffer circuitry providing greater stability can be more expensive. Accordingly, the selection of a buffer circuit for a PWM DAC often requires a tradeoff between cost and accuracy.

SUMMARY

In general, the invention is directed to a PWM DAC providing a low impedance output, thermal stability, and very low cost. The PWM DAC is especially useful in circuits that do not require absolute accuracy without calibration, but where medium resolution and temperature stability are desired. The PWM DAC includes an emitter follower buffer providing a low impedance current sinking output circuit that enables inexpensive implementation of a buffered PWM DAC. A bipolar transistor used in conventional emitter follower buffer circuits usually is susceptible to substantial temperature-induced variations in base-emitter junction voltage.

A PWM DAC, in accordance with the invention, provides a compensation circuit that adjusts the digital input value applied to the PWM to compensate for temperature-induced variation introduced by the emitter follower buffer circuit. In this manner, the invention is capable of providing a DAC implementation that is both stable with temperature changes and inexpensive.

The compensation circuit may incorporate circuitry that replicates the PWM DAC at least in part, and monitors the base-emitter voltage of a replicated emitter follower buffer to track temperature-induced variation in the PWM DAC. In some embodiments, the compensation circuit generates an error value that can be used to temperature compensate multiple PWM DACs within a particular system.

In one embodiment, the invention provides a DAC comprising a PWM that generates an output pulse having a pulse width as a function of a digital input value. A filter converts the output pulse into an analog output signal, and an emitter follower buffer circuit that buffers the analog output signal. In addition, a compensation circuit adjusts the digital input value to compensate for variation in the emitter follower buffer circuit.

In another embodiment, the invention provides a system comprising a first PWM DAC having a first emitter follower buffer circuit, and a second PWM DAC having a second emitter follower buffer circuit. A compensation circuit adjusts digital input values applied to the first and second PWM DACS to compensate for variation in the first and second emitter follower buffer circuits.

In an added embodiment, the invention provides a method for temperature compensating a DAC having a PWM that generates an output pulse having a pulse width as a function of a digital input value, a filter that converts the output pulse into an analog output signal, and an emitter follower buffer circuit that buffers the analog output signal. The method involves adjusting the digital input value to compensate for variation in the emitter follower buffer circuit.

In a further embodiment, the invention provides a DAC comprising a PWM that generates an output pulse having a pulse width as a function of a digital input value, means for converting the output pulse into an analog output signal, means for buffering the analog output signal, and means for adjusting the digital input value to compensate for variation in the buffering means.

The invention may provide one or more advantages. For example, the invention provides a PWM DAC that can be implemented using inexpensive emitter follower buffer circuitry without suffering from the temperature-dependence ordinarily associated with such circuitry. Instead, an inexpensive compensation circuit ensures that the PWM DAC produces an analog output waveform that is both stable and accurate over a wide range of operating temperatures. In addition, the compensation circuitry can be readily implemented in low-cost integrated circuitry, e.g., ASIC or FPGA.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
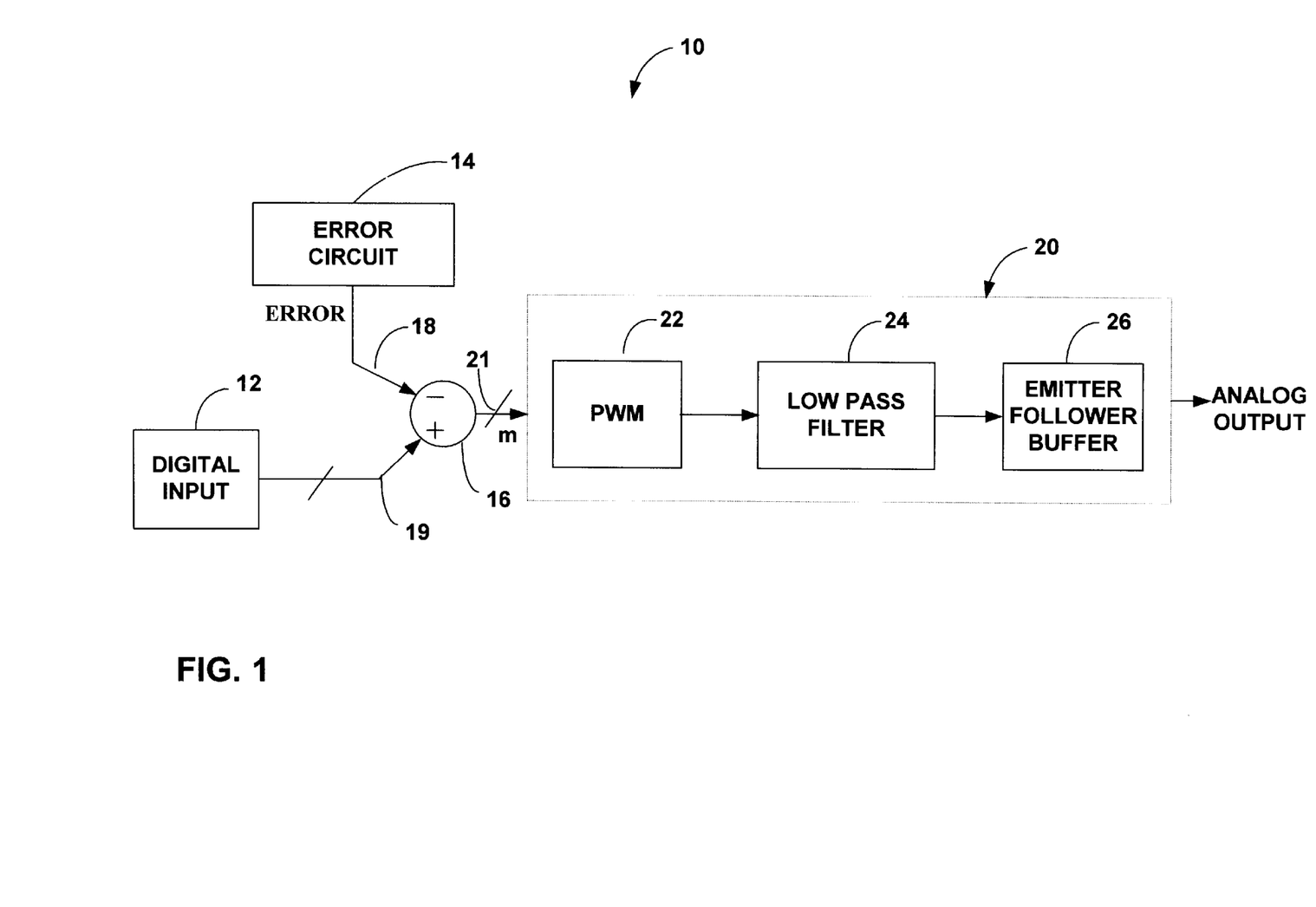
FIG. 1 is a block diagram illustrating an exemplary embodiment of a PWM DAC system with a compensation input.

FIG. 1 is a block diagram illustrating an embodiment of a PWM DAC system 10 with a compensation input. As shown in FIG. 1, system 10 may include a digital input 12 and an error circuit 14. Error circuit 14 applies a digital error value 18 to the positive input of subtractor circuit 16. Digital input 12 applies a digital input value 19 to another input of subtractor circuit 16. Subtractor circuit 16 subtracts the digital error value 18 from the digital input value 19 to produce an adjusted digital input value 21 that is applied to PWM DAC 20. In particular, the adjusted digital input value 21 is applied to an m-bit input of a PWM 22.

PWM 22 generates an output pulse having a pulse width that varies as a function of the adjusted digital input value 21 produced by subtractor circuit 16. A low pass filter circuit 24 converts the output pulse into an analog output signal. An emitter follower buffer circuit 26 buffers the analog output signal to produce a buffered analog output. As will be described, error circuit 14 and subtractor circuit 16 together serve as a compensation circuit. In particular, the compensation circuit adjusts the digital input value 19 provided by digital input 12 to compensate for temperature-induced variation in emitter follower buffer circuit 26. In this manner, PWM DAC 20 can be implemented using an emitter follower buffer circuit to reduce cost while promoting stability and accuracy.

Figure 2:
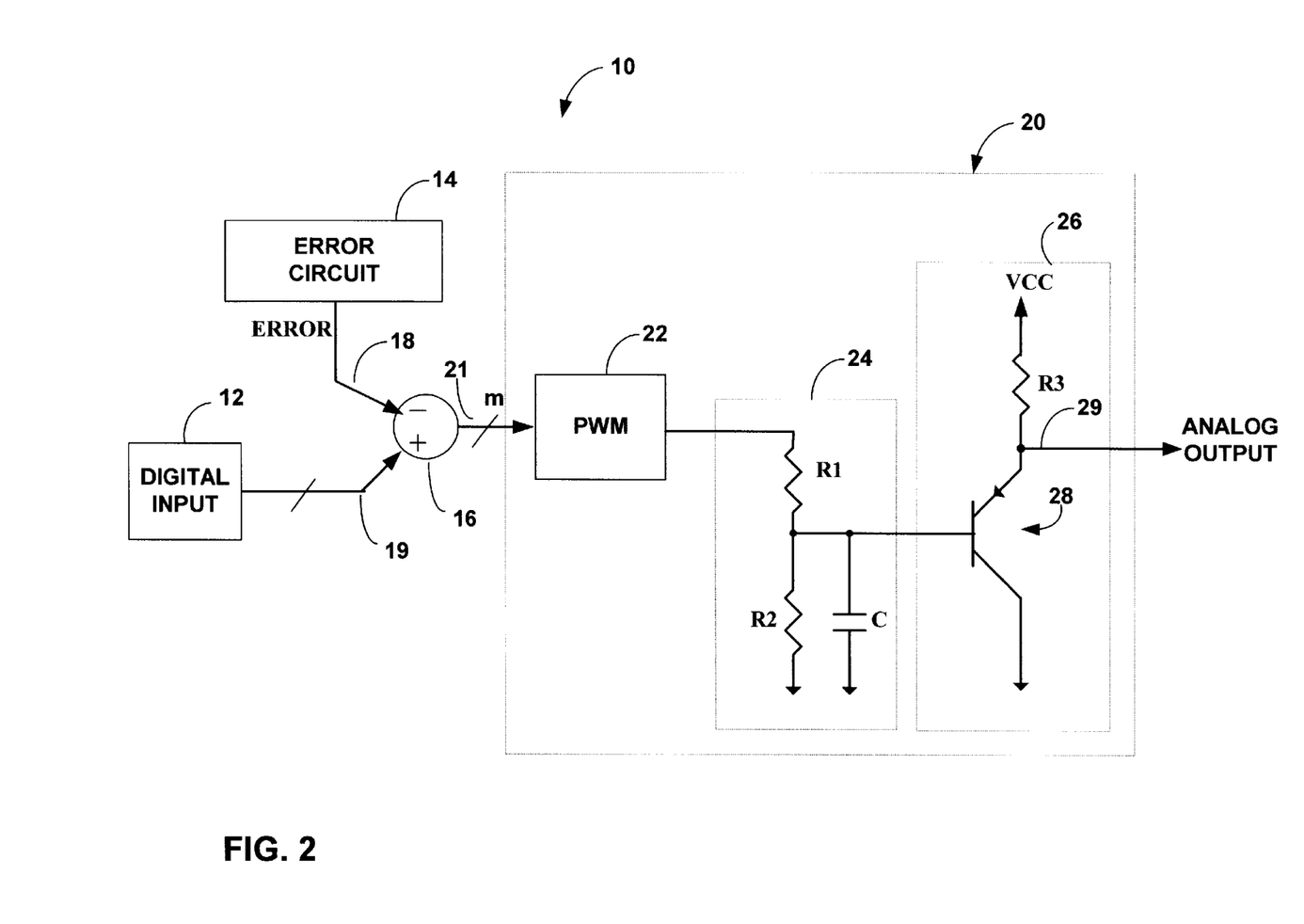
FIG. 2 is a schematic diagram illustrating the PWM DAC system of FIG. 1 in greater detail.

FIG. 2 is a schematic diagram illustrating system 10 of FIG. 1 in greater detail. As shown in FIG. 2, low pass filter circuit 24 of PWM DAC 20 may incorporate a simple RC network. PWM 22 has an output that is coupled to a voltage divider formed by resistors R1 and R2. A capacitor C is coupled between the R1/R2 node and ground. In turn, emitter follower buffer circuit 26 includes a bipolar transistor 28 with a base coupled across resistor R2 and capacitor C. Notably, transistor 28 buffers the analog output signal in a current sinking mode. A load resistor R3 is coupled between a voltage supply VCC and the emitter of transistor 28. When transistor 28 is on, current flows across resistor R3 to the emitter of transistor 28. The voltage drop across resistor R3 determines the analog voltage output at the emitter of transistor 28, as indicated by reference numeral 29.

Figure 3:
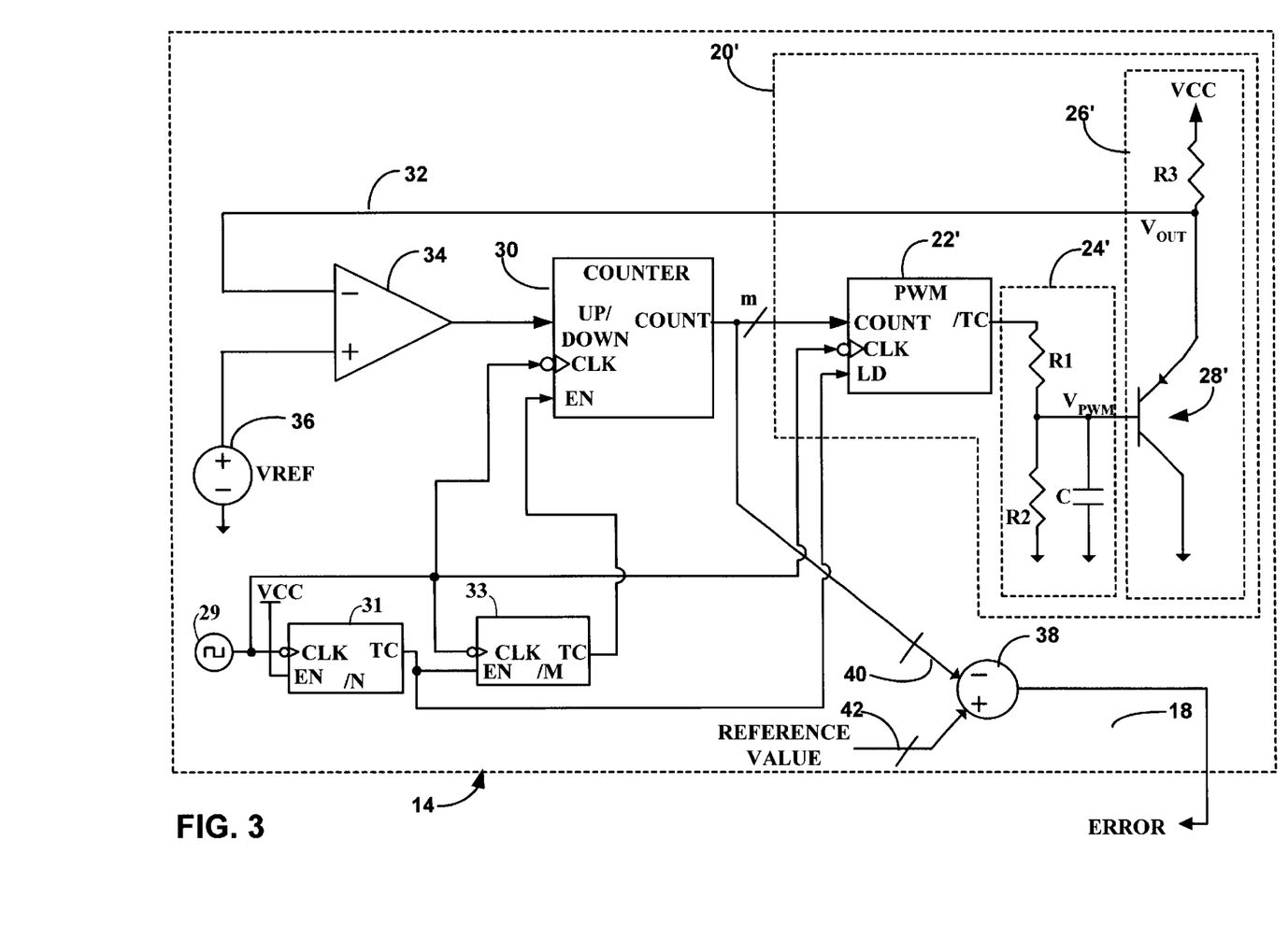
FIG. 3 is a schematic diagram illustrating an embodiment of a compensation circuit for use with the PWM DAC system of FIG. 2.

FIG. 3 is a schematic diagram illustrating an embodiment of an error circuit 14 for use with system 10 of FIG. 2. Error circuit 14 replicates the circuitry of PWM DAC 20 in order to track temperature-induced variations in the emitter-base voltage of transistor 28. To that end, error circuit 14 includes a "reference" PWM DAC with a reference PWM 22', a reference filter circuit 24' and a reference emitter follower buffer circuit 26' with reference transistor 28'. The reference PWM DAC 20' of error circuit 14 is a "reference" circuit in the sense that it tracks the variation in an emitter follower buffer circuit that is substantially identical to the emitter follower buffer circuit provided in PWM DAC 20.

As will be described, error circuit 14 incorporates a feedback loop that produces a digital error value representative of the amount of temperature-dependent variation present in the base-emitter voltage of transistor 28'. To provide good temperature tracking, reference PWM DAC 20' should be substantially identical to and physically close to PWM DAC 20 to which the output of error circuit 14 is to be applied. In other words, PWM DAC 20' should be located in a position likely to experience temperature variations similar to those experienced by PWM DAC 20.

In operation, an up/down counter 30 generates an m-bit counter value that is applied to the input of PWM 22'. In the example of FIG. 3, PWM 22' may be implemented as a downcounter with a maximum count of N. Every N counts, referred to as the count period, PWM 22' is loaded with the current m-bit counter value produced by up/down counter 30.

Once loaded, PWM 22' counts down from the counter value to zero in response to a clock signal. During the count-down, PWM 22' generates a high output pulse. For example, PWM 22' may have a not terminal count (NTC) output. In this case, when PWM 22' reaches zero, the output pulse goes low and stays low for the duration of the count period, i.e., N less the loaded counter value from up/down counter 30. PWM 22' is reloaded with the count value from up/down counter 30 after N counts have elapsed.

Filter circuit 24 converts the output pulse from PWM 22' into an analog output signal. The level of the analog output signal is proportional to the number of counts between the up/down counter value and zero, relative to the maximum number of counts N. Accordingly, the level of the analog output signal produced by filter circuit 24' is proportional to the width of the output pulse produced by PWM 22'.

If the maximum count N is 256, for example, and PWM 22' is loaded with a count value of 63 from up/down counter 30, the output of the PWM will be high until the downcounter reaches zero, i.e., after 64 counts. The duty cycle of the output pulse produced by PWM 22' in this example, once filtered, should yield an analog signal level that is 25% of the maximum analog signal level. After 256 clock cycles, PWM 22' is reloaded with the then-existing counter value produced by up/down counter 30.

Emitter follower buffer circuit 26' in reference PWM DAC 20' buffers the analog output signal produced by filter circuit 24'. In particular, emitter follower buffer circuit 26' produces a buffered analog output signal at the emitter of transistor 28'. To track the temperature-dependent variation of the base-emitter junction voltage of transistor 28', error circuit 14 provides a feedback loop 32. Feedback loop 32 is coupled to the inverting input of a comparator 34.

Comparator 34 compares the analog output signal fed back by loop 32 to an analog reference signal WREF, set by a voltage source 36. The analog reference signal VREF may be a voltage well within the operating range of the DAC so that any errors within that range are compensated by the correction loop provided by error circuit 14. If DACs 20, 20' run in the range of 0.7 to 1.2 volts, for example, one could choose a voltage of 1.0 volts. In some embodiments, error circuit 14 also may be useful in compensating for power supply variation.

For example, the output voltage $V_{PWM}$ of filter circuit 24', e.g., as observed at the base of transistor 28', can be set based on the minimum expected operating voltage of the power supply $V_{CC\_min}$. By setting $V_{PWMMAX}$ to equal $V_{outmax}-V_{bemin}$ at $V_{CC\_min}$, and setting the digital reference value 42 ($V_{REFDigital}$) to equal N * ($V_{REF}-V_{bemin}$)/$V_{PWMMAX}$, where $V_{outmax}$ is the maximum expected output voltage at the emitter of transistor 28' and $V_{bemin}$ is the minimum expected base-emitter voltage of transistor 28', error circuit 14 will compensate for supply variations above and below nominal because the control loop adjusts the digital error signal even though the /TC output voltage produced by downcounter 22' is changing due to the power supply variation.

Also, if the power supply voltage is well regulated, and the reference voltage at voltage source 36 is substantially temperature invariant, then the only variation in counter 30 will be due to the base-emitter junction voltage variation of transistor 28'. Since the base-emitter junction voltage of 28' can be characterized as a function of temperature, the temperature of transistor 28' can be determined.

Comparator 34 provides an indication of the temperature-dependent variation in emitter follower buffer circuit 26'. Based on the comparison, comparator 34 generates a comparator signal that is applied to the up/down control input of up/down counter 30. As further shown in FIG. 3, error circuit 14 may include clock 29, counter 31 and counter 33, which govern timing operations with respect to counter 30 and PWM 22'. Clock 29 drives clock inputs on counter 3 1, counter 33, counter 30 and PWM 22'. In turn, counter 31 has an output that drives the load input (LD) of PWM 22', and the enable input (EN) of counter 33, whereas counter 33 has an output that drives the enable input (EN) of counter 30. As shown in FIG. 3, counters 31 and 33 have terminal count (TC) outputs. Comparator 34, up/down counter 30 and PWM DAC 20' form a discrete time control loop with a loop sampling time set by counter 33.

For feedback loop stability, the sampling interval set by counter 33 is chosen such that the count delay of PWM 22' and the RC time constant of R1, R2 and C in filter circuit 24' are small compared to the sampling period from counter 33. As an illustration, counter 31 could be configured to count to N=255, the count period for PWM 22', whereas counter 33 could count to M=10 to establish the sampling interval for counter 30. When N reaches 255, the TC output of counter 31 causes PWM 22' to load the next m-bit counter value from counter 30. When M reaches 10, the TC output of counter 33 enables counter 30, causing counter 30 to increment or decrement the m-bit counter value based on the output of comparator 34.

Up/down counter 30 increments or decrements the up/down counter value based on the comparator signal. If the comparator signal is high, up/down counter 30 increments the existing counter value. If the comparator signal is low, up/down counter 30 decrements the existing counter value. In each case, up/down counter 30 adjusts the counter value in response to the clock and enable signals.

Up/down counter 30 applies the counter value to PWM 22 and a subtractor circuit 38. In particular, up/down counter 30 applies the counter value as the minuend 40 to subtractor circuit 38. The subtrahend 42 of subtractor circuit 38 is a digital reference value. Subtractor circuit 38 subtracts the counter value from the digital reference value to generate a digital error value 18. As described with reference to FIGS. 1 and 2, the digital error value 18 is applied to subtractor circuit 16 to adjust the digital input value applied to a PWM DAC 20.

Subtraction of the counter value from the digital reference value by subtractor circuit 38 serves to quantify the amount of temperature variation in reference transistor 28'. In particular, the counter value represents the dynamic condition of reference transistor 28 under present temperature conditions, whereas the digital reference value represents an expected counter value for a reference temperature level.

The analog output signal from reference filter circuit 24' and the analog output signal at the emitter output of transistor 28' reflects a voltage difference that varies as a function of the base-emitter junction voltage of the transistor. The junction voltage ordinarily ranges between 0.3 volts and 0.7 volts, depending on the operating temperature of transistor 28'. However, a theoretical duty cycle for PWM 22' can be calculated for a given temperature level. Slight errors may arise between the calculated theoretical duty cycle and the real transistors, causing errors in the absolute accuracy of the DAC(s). However, a primary application is when one or more DACs are part of an externally calibrated control circuit where initial accuracy comes from an external reference at calibration time. In this case, the DACs need only maintain long term stability and accuracy over temperature.

With 85 degrees C. taken as the maximum operating temperature of PWM DAC 20', for example, the base-emitter voltage of transistor 28' will be at its minimum at this maximum temperature, while the count value applied to PWM 22' from up/down counter 30 will be at its maximum.

The count value will be at its maximum because the difference between the emitter voltage and the analog output signal from filter circuit 24' will be at its minimum.

At all temperatures less than 85 degrees C., the count value applied to PWM 22' will be less, because the base-emitter voltage of transistor 28' will be greater. Accordingly, if 85 degrees C. value is the subtrahend and the up/down counter value is the minuend to subtractor circuit 38, the difference is an error term which will always be positive for temperatures less than 85 degrees C.

Figure 4:
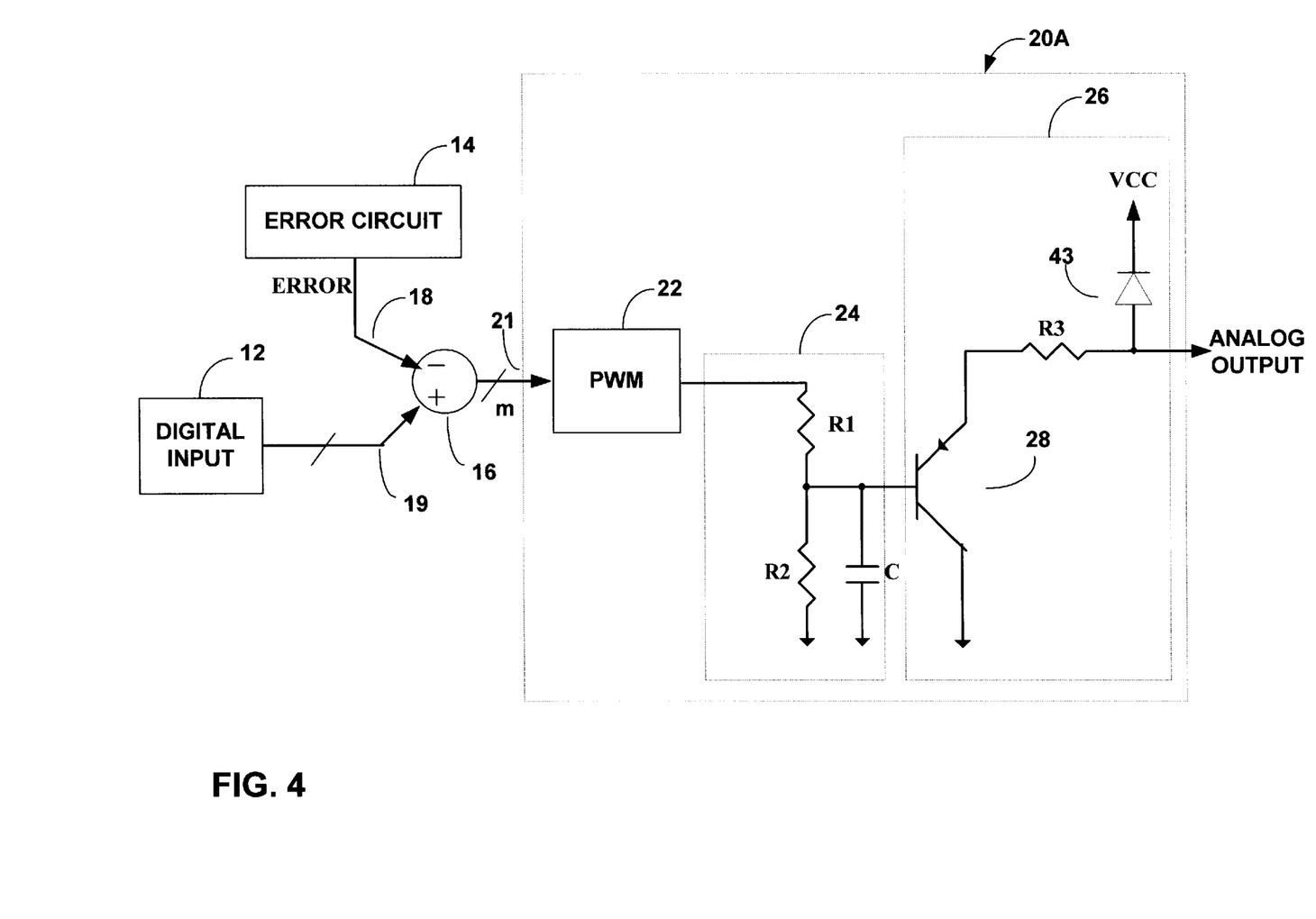
FIG. 4 is a schematic diagram illustrating an exemplary application for the PWM DAC system of FIG. 1.

By applying the resulting digital error value from subtractor circuit 38 to subtractor circuit 16, the digital input value applied to a PWM DAC 20 can be adjusted, and the PWM DAC can be made to track temperature-dependent variations in emitter follower buffer circuit 26, and thereby produce consistent output over a range of temperatures. Indeed, the digital error value produced by error circuit 14 can be applied to any number of PWM DACs to provide controlled tracking versus temperature. FIG. 4 is a schematic diagram illustrating an exemplary application for the PWM DAC system 10 of FIG. 1. In particular, FIG. 4 depicts a PWM DAC 20A that substantially conforms to PWM DAC 20, but includes a photodiode 43 coupled between a power supply VCC and resistor R3. Photodiode 43 represents a monitor photodiode, e.g., a back-facet monitor, that monitors the output power of a laser diode.

In the example of FIG. 4, PWM DAC 20A can be used to control a digital laser driver control loop by adjusting the analog output of emitter follower buffer 26. The emitter voltage of transistor 28 can be controlled to thereby control the amount of current that is sunk to ground via the transistor, and the resultant voltage drop across resistor R3. In this manner, PWM DAC 26 can influence the level of current or voltage received from photodiode 43 by a laser driver circuit coupled to the photodiode/resistor R3 node.

Figure 5:
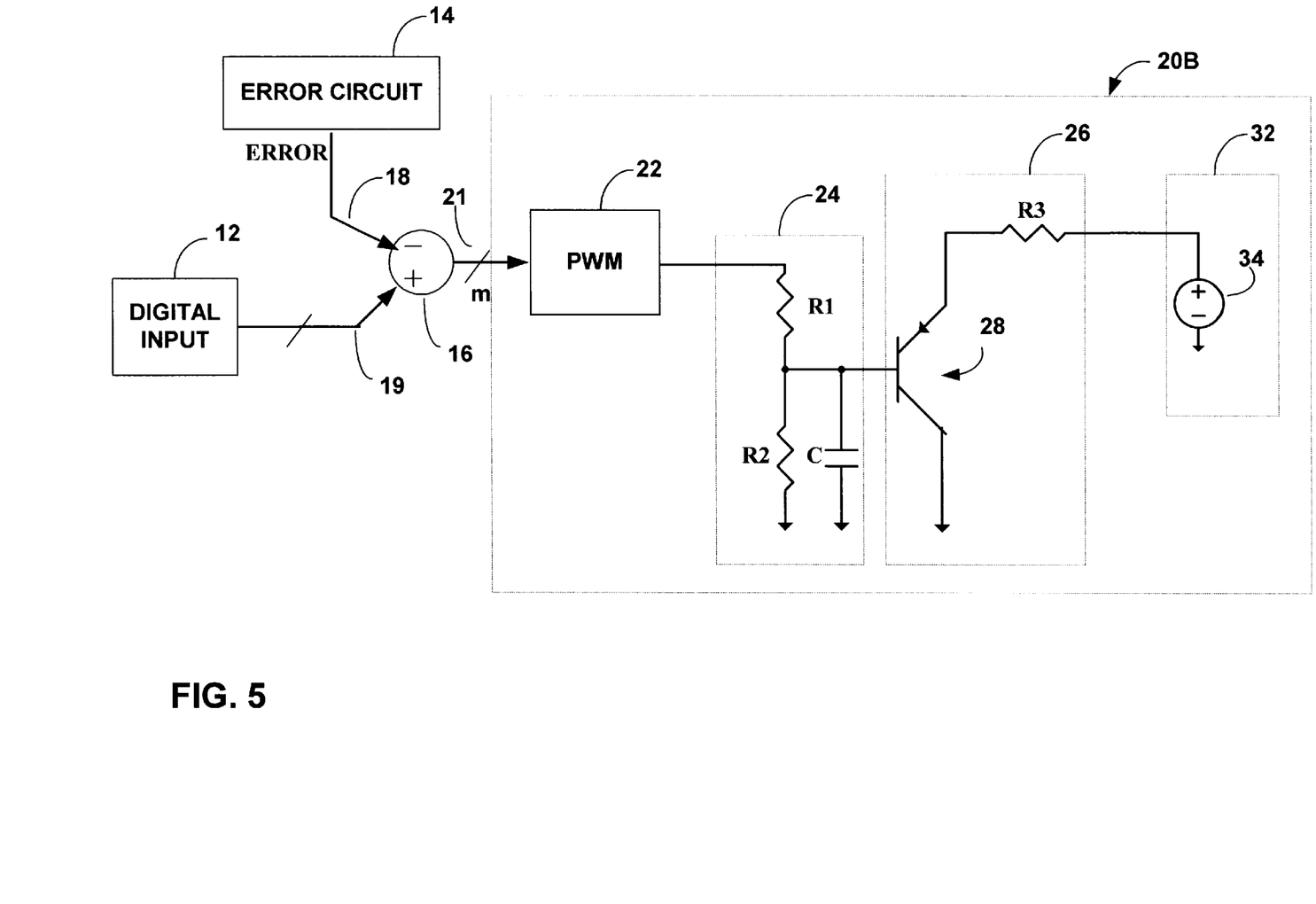
FIG. 5 is a schematic diagram illustrating another exemplary application for the PWM DAC system of FIG. 1.

FIG. 5 is a schematic diagram illustrating another exemplary application for the PWM DAC system 10 of FIG. 1. FIG. 5 depicts a PWM DAC 20B that substantially conforms to PWM DAC 20, but includes a resistor R3 coupled to the current driver input of a laser driver control circuit 32. As shown in FIG. 5, laser driver control circuit 32 provides a bias input that, in effect, couples resistor R3 to a constant voltage source 34. In the example of FIG. 4, PWM DAC 20A can be used to control the emitter voltage of transistor 28 in relation to the voltage at constant voltage source 34, and thereby control the current across resistor R3. The current across resistor R3 can be used, for example, to control the bias current applied to a laser diode.

Figure 6:
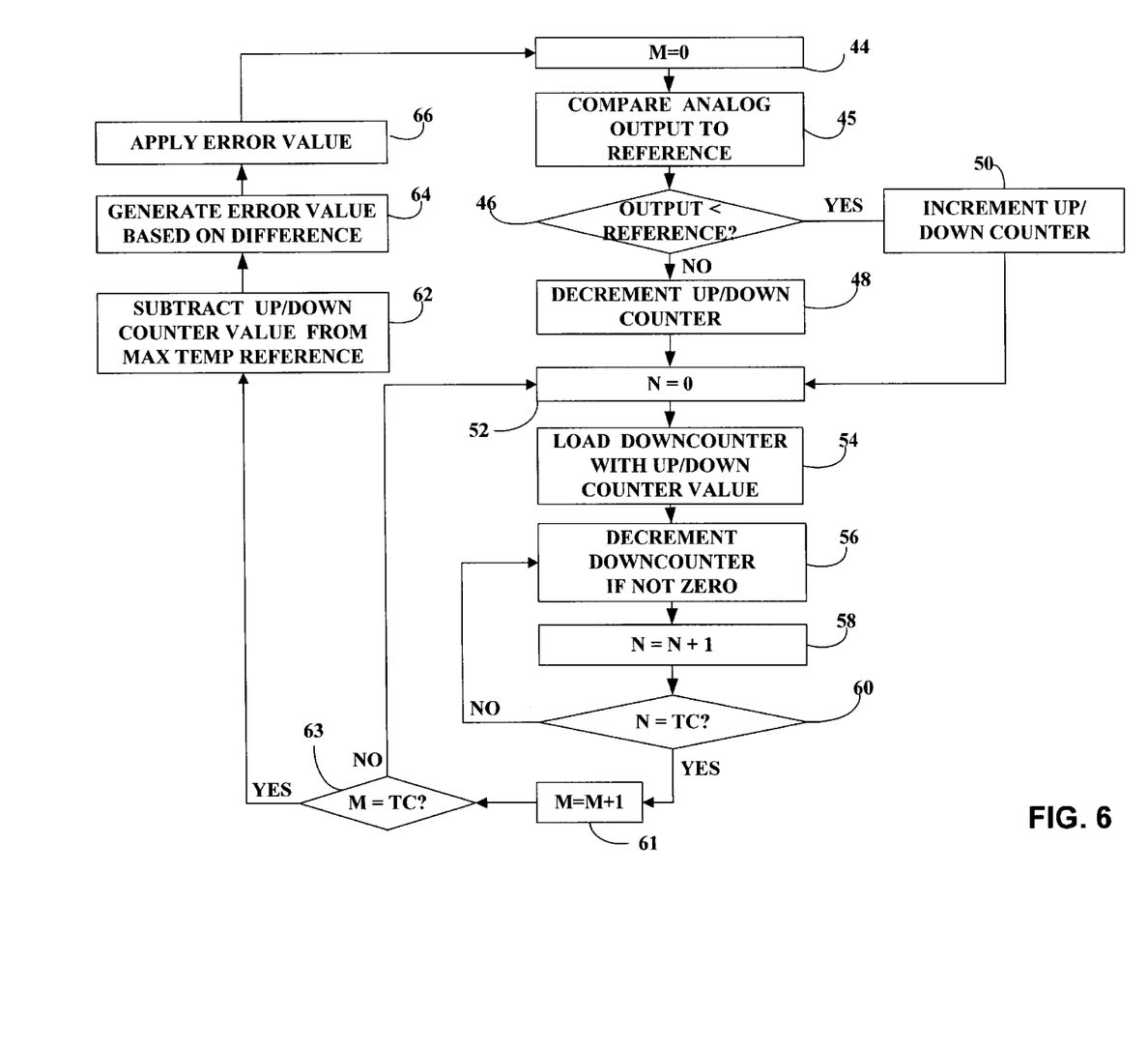
FIG. 6 is a flow diagram illustrating exemplary operation of the PWM DAC system of FIG. 1.

FIG. 6 is a flow diagram illustrating exemplary operation of the PWM DAC system 10 of FIG. 1. With the value of M in counter 33 initially set to zero (44), comparator 34 (FIG. 3) of error circuit 14 compares the analog output of emitter follower buffer circuit 26' to a reference level VREF (45). If the analog output is greater than the reference level (46), up/down counter 30 decrements the up/down counter value (48). If the analog output is less than the reference level (46), up/down counter 30 increments the up/down counter value (50).

To start a new downcounter cycle for PWM 22', N is initially reset to zero (52) and the downcounter PWM is loaded with the counter value from up/down counter 30 (54). As downcounter PWM 22' is decremented (56) in response to the clock signal from clock 29, the count N is incremented (58). Downcounter PWM 22' continues to decrement until count N reaches its maximum value or the downcounter value reaches zero. The resulting width of the output pulse from downcounter PWM 22 determines the output analog value produced by filter circuit 24 and emitter follower buffer circuit 26. In turn, the analog output voltage determines whether up/down counter 30 is incremented or decremented.

The value of M maintained by counter 33 is incremented (61) each time the counter value of counter 31 reaches the terminal count output (60). When the maximum value of counter M is reached (63), i.e., every N*M counts, the up/down counter value is subtracted from the maximum temperature reference value (62) and a digital error value is generated based on the difference (64). The digital error value is applied to adjust the digital input value to one or more PWM DACs (66), and the temperature compensation process continues. Thus, the temperature variation of the reference PWM DAC 20' in error circuit 14 can be used to estimate the temperature variation of other PWM DACs 20 that incorporate substantially identical emitter follower buffer circuits. The digital error value from error circuit 14 can be used to reduce error in the PWM DACs 20 and thereby promote accuracy and stability.

Figure 7:
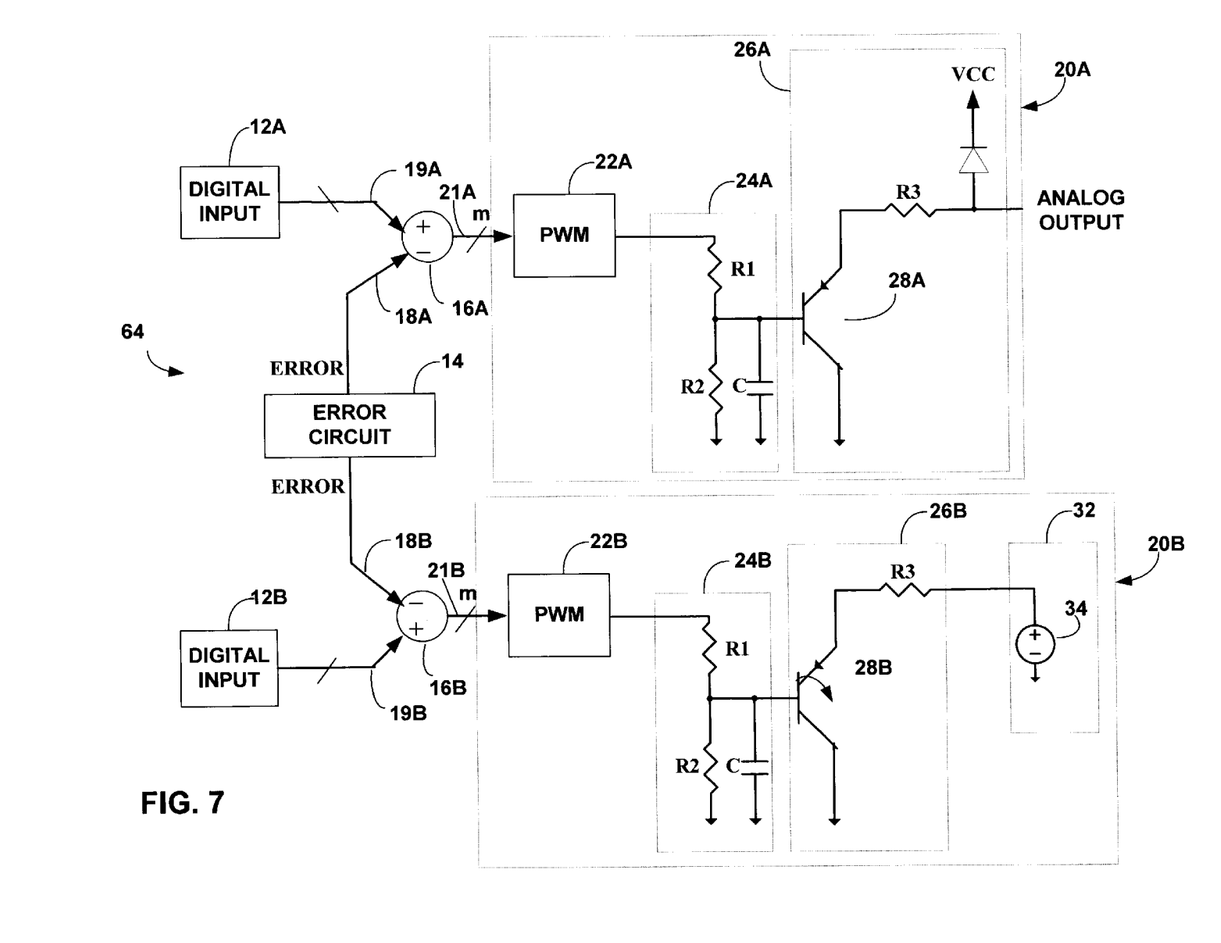
FIG. 7 is a schematic diagram illustrating use of a compensation circuit with multiple PWM DACs.

FIG. 7 is a schematic diagram illustrating use of a compensation circuit with multiple PWM DACs 20A, 20B. As shown in FIG. 7, error circuit 14 generates a digital error value that can be applied to subtractor circuits 16A, 16B to form compensation circuits for two or more PWM DACs 26A, 26B. In the example of FIG. 7, the single digital error value produced by error circuit 14 is provided to inputs 18A, 18B of subtractor circuits 16A, 18B, which adjust digital input values provided by two different digital inputs 12A, 12B. In this manner, a single error circuit 14 permits compensation of multiple PWM DACs 20A, 20B to reduce the temperature-dependent variation in emitter follower buffer circuits 20A, 20B. Provided the reference PWM DAC 20' is substantially co-located with the operational PWM DACS 20, such that they experience a common range of operating temperatures, error circuit 14 can be used with any number of PWM DACs.

In some embodiments, a plurality of PWM DACs can be configured to share a common subtractor 16 on a multiplexed basis. For example, the error value 18 from error circuit 14 can be subtracted from the digital input value 19 for each of the different PWM DACS using a single subtractor that performs subtraction for each PWM DAC within a particular time slot. In this case, the subtractor 16 and associated timing and logic circuitry may be realized in FPGA or an ASIC, possibly conserving the number of gates needed for the error function. In some embodiments, the subtractor and associated timing and logic may be formed within a processor.

Various embodiments of the invention have been described. These and other embodiments are within the scope of the following claims.

What is claimed is:

1. A digital-to-analog converter comprising:
   a pulse width modulator that generates an output pulse having a pulse width as a function of a digital input value;
   a filter that converts the output pulse into an analog output signal;
   an emitter follower buffer circuit that buffers the analog output signal; and
   a compensation circuit that adjusts the digital input value to compensate for variation in the emitter follower buffer circuit.

2. The digital-to-analog converter of claim 1, wherein the compensation circuit includes:
   an error circuit that generates a digital error value based on estimated variation in the emitter follower buffer circuit; and
   a subtractor circuit that adjusts the digital input value by subtracting the digital error value from the digital input value.

3. The digital-to-analog converter of claim 2, wherein the error circuit includes a reference circuit that substantially replicates the pulse width modulator, the filter and the emitter follower buffer circuit, the error circuit generating the digital error value based on variation in the replicated emitter follower buffer circuit.

4. The digital-to-analog converter of claim 2, wherein the compensation circuit includes:
   an up/down counter that generates a counter value;
   a downcounter that counts down from the counter value to zero and generates a second output pulse during the count-down;
   a second filter circuit that converts the second output pulse to a second analog output signal;
   a second emitter follower buffer circuit that buffers the second analog output signal;
   a comparator that compares the second analog output signal to an analog reference signal to estimate the variation in the emitter follower buffer circuit, and generates a comparator signal based on the comparison, wherein the up/down counter increments or decrements the counter value based on the comparator signal; and
   a second subtractor that subtracts the counter value from a digital reference value to generate the digital error value.

5. The digital-to-analog converter of claim 4, wherein the digital reference value corresponds to an expected value of the counter value for a predetermined temperature level.

6. The digital-to-analog converter of claim 4, wherein the second emitter follower buffer circuit is substantially identical to the emitter follower buffer circuit.

7. The digital-to-analog converter of claim 4, wherein the pulse width modulator includes a downcounter that counts down from the adjusted digital input value to zero and generates the output pulse during the count-down.

8. The digital-to-analog converter of claim 4, wherein the downcounter counts down from the counter value in response to a clock pulse, and reloads the existing counter value generated by the up/down counter every N clock pulses.

9. The digital-to-analog converter of claim 1, wherein the variation includes a temperature variation.

10. The digital-to-analog converter of claim 1, wherein the variation corresponds to variation in a base-emitter junction voltage of a bipolar transistor of the emitter follower buffer circuit.

11. A system comprising:
    a first pulse width modulator-based digital-to-analog converter having a first emitter follower buffer circuit;
    a second pulse width modulator-based digital-to-analog converter having a second emitter follower buffer circuit; and
    a compensation circuit that adjusts digital input values applied to the first and second pulse width modulator-based digital-to-analog converters to compensate for variation in the first and second emitter follower buffer circuits.

12. The system of claim 11, wherein the compensation circuit includes:

an error circuit that generates a digital error value based on estimated variation in the first and second emitter follower buffer circuits; and a subtractor that adjusts the digital input values applied to the first and second pulse width modulator-based digital-to-analog converters by subtracting the digital error value from each of the respective digital input value.

13. The system of claim 12, wherein the error circuit includes a reference circuit that substantially replicates one of the first and second pulse width modulator-based digital-to-analog converters, the error circuit generating the digital error value based on variation in an emitter follower buffer circuit within the replicated pulse width modulator-based digital-to-analog converter.

14. The system of claim 12, wherein the compensation circuit includes:

an up/down counter that generates a counter value;

a downcounter that counts down from the counter value to zero and generates an output pulse during the count-down;

a filter circuit that converts the output pulse to an analog output signal;

a third emitter follower buffer circuit that buffers the analog output signal;

a comparator that compares the analog output signal to an analog reference signal to estimate the variation in the third emitter follower buffer circuit, and generates a comparator signal based on the comparison, wherein the up/down counter increments or decrements the counter value based on the comparator signal; and a second subtractor that subtracts the counter value from a digital reference value to generate the digital error value.

15. The system of claim 14, wherein the digital reference value corresponds to an expected value of the counter value for a predetermined temperature level.

16. The system of claim 14, wherein the third emitter follower buffer circuit is substantially identical to each of the first and second emitter follower buffer circuits.

17. The system of claim 14, wherein the downcounter counts down from the counter value in response to a clock pulse, and reloads the existing counter value generated by the up/down counter every N clock pulses.

18. The system of claim 11, wherein the variation includes a temperature variation.

19. The system of claim 11, wherein the variation corresponds to variation in a base-emitter junction voltage of a bipolar transistor of each of the first and second emitter follower buffer circuits.

20. A method for compensating a digital-to-analog converter having a pulse width modulator that generates an output pulse having a pulse width as a function of a digital input value, a filter that converts the output pulse into an analog output signal, and an emitter follower buffer circuit that buffers the analog output signal, the method comprising adjusting the digital input value to compensate for variation in the emitter follower buffer circuit.

21. The method of claim 20, further comprising:

generating a digital error value based on estimated variation in the emitter follower buffer circuit; and adjusting the digital input value by subtracting the digital error value from the digital input value.

22. The method of claim 21, further comprising generating the digital error value based on variation in the a second emitter follower buffer circuit substantially identical to the emitter follower buffer circuit.

23. The method of claim 21, further comprising:

generating a counter value;

counting down from the counter value to zero;

generating a second output pulse during the count-down;

converting the second output pulse to a second analog output signal;

buffering the second analog output signal with a second emitter follower buffer circuit;

comparing the second analog output signal to an analog reference signal to estimate the variation in the emitter follower buffer circuit;

generating a comparator signal based on the comparison, wherein the up/down counter increments or decrements the counter value based on the comparator signal; and subtracting the counter value from a digital reference value to generate the digital error value.

24. The method of claim 23, wherein the digital reference value corresponds to an expected value of the counter value for a predetermined temperature level.

25. The method of claim 20, wherein the variation includes a temperature variation.

26. The method of claim 20, wherein the variation corresponds to variation in a base-emitter junction voltage of a bipolar transistor of the emitter follower buffer circuit.

27. A digital-to-analog converter comprising:

a pulse width modulator that generates an output pulse having a pulse width as a function of a digital input value;

means for converting the output pulse into an analog output signal;

means for buffering the analog output signal; and means for adjusting the digital input value in response to an error value representing estimated variation in the buffering means to compensate for variation in the buffering means.

28. The digital-to-analog converter of claim 27, wherein the error value is a digital error value, the digital-to-analog converter further comprising:

means for generating the digital error value based on the estimated variation in the buffering means; and means for adjusting the digital input value by subtracting the digital error value from the digital input value.

29. The digital-to-analog converter of claim 28, further comprising means for generating the digital error value based on variation in a second buffering means substantially identical to the buffering means.

30. The digital-to-analog converter of claim 27, further comprising:

up/down counter means for generating a counter value;

downcounter means for counting down from the counter value to zero;

means for generating a second output pulse during the count-down;

means for converting the second output pulse to a second analog output signal;

means for buffering the second analog output signal with a second buffering means;

means for comparing the second analog output signal to an analog reference signal to estimate the variation in the buffering means;

means for generating a comparator signal based on the comparison, wherein the up/down counter means increments or decrements the counter value based on the comparator signal; and means for subtracting the counter value from a digital reference value to generate the digital error value.

31. The digital-to-analog converter of claim 30, wherein the digital reference value corresponds to an expected value of the counter value for a predetermined temperature level.

32. The digital-to-analog converter of claim 27, wherein the variation includes a temperature variation.

33. The digital-to-analog converter of claim 27, wherein the variation corresponds to variation in a base-emitter junction voltage of a bipolar transistor of the buffer means.

34. A digital-to-analog converter comprising:

a pulse width modulator that generates an output pulse having a pulse width as a function of a digital input value; and a compensation circuit having a reference circuit that substantially replicates the pulse width modulator and outputs a digital error value for adjusting the digital input value based on temperature variation in the reference circuit.

35. A digital-to-analog converter comprising:

a pulse width modulator that generates an output pulse having a pulse width as a function of a digital input value;

means for converting the output pulse into an analog output signal;

means for buffering the analog output signal; and means for adjusting the digital input value to compensate for temperature variation in the buffering means.

36. A digital-to-analog converter comprising:

a pulse width modulator that generates an output pulse having a pulse width as a function of a digital input value;

means for converting the output pulse into an analog output signal;

means for buffering the analog output signal; and means for adjusting the digital input value to compensate for variation in a base-emitter junction voltage of a bipolar transistor in the buffering means.

* * * * *